US012566210B2

(12) United States Patent
Sengodan et al.

(10) Patent No.: US 12,566,210 B2
(45) Date of Patent: Mar. 3, 2026

(54) SYSTEM AND METHOD FOR TESTING AN INTEGRITY OF A FACE SEAL IN AN ELECTRICAL SYSTEM

(71) Applicant: Hamilton Sundstrand Corporation, Charlotte, NC (US)

(72) Inventors: Rajkumar Sengodan, Namakkal (IN); Debasis Rout, Baleswar (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 156 days.

(21) Appl. No.: 18/481,691

(22) Filed: Oct. 5, 2023

(65) Prior Publication Data

US 2025/0012856 A1 Jan. 9, 2025

(30) Foreign Application Priority Data

Jul. 7, 2023 (IN) .............................. 202311045929

(51) Int. Cl.
    *G01R 31/28* (2006.01)
    *G01R 1/073* (2006.01)

(52) U.S. Cl.
    CPC ..... *G01R 31/2886* (2013.01); *G01R 1/07307* (2013.01)

(58) Field of Classification Search
    CPC ... G01R 31/001; G01R 31/50; G01R 1/06788
    USPC ..... 324/522, 750.24, 750.26, 754.02, 755.01
    See application file for complete search history.

(56) References Cited

U.S. PATENT DOCUMENTS

| | | | |
|---|---|---|---|
| 4,414,506 | A | 11/1983 | Kelley |
| 4,789,829 | A | 12/1988 | Stribling |
| 5,061,899 | A | 10/1991 | Kudo |
| 5,276,395 | A | 1/1994 | Malloy |
| 5,397,996 | A | 3/1995 | Keezer |
| 5,581,019 | A | 12/1996 | Minor et al. |
| 6,605,953 | B2 | 8/2003 | McAllister et al. |

(Continued)

FOREIGN PATENT DOCUMENTS

| | | |
|---|---|---|
| CA | 2397106 A1 | 2/2003 |

OTHER PUBLICATIONS

Search Report issued in European Patent Application No. 24186652. 4; Date of Mailing Nov. 19, 2024 (10 pages).

*Primary Examiner* — Roberto Velez
(74) *Attorney, Agent, or Firm* — CANTOR COLBURN LLP

(57) ABSTRACT

Testing a gasket within a groove formed around a top of an enclosure and covered by a lid, including steps of: positioning a needle of a probe within a notch formed in an outer wall that surrounds the groove; and: injecting input current through the probe; comparing input voltage from the probe in the notch and an output voltage induced in conductive fasteners that secure the lid to the enclosure, to determine that a difference in the voltages is within a predetermined range, where voltage at the fasteners is measured with another probe; or injecting the input current into the fasteners; and comparing the input voltage at the fasteners with the output voltage induced in the gasket and measured via the probe in the notch, to determine that the difference in the voltages is within the predetermined range, where voltage at the fasteners is measured with the another probe.

19 Claims, 9 Drawing Sheets

(56) References Cited

U.S. PATENT DOCUMENTS

| | | | |
|---|---|---|---|
| 6,734,689 B1 * | 5/2004 | Yang .................. | G01R 1/06772 |
| | | | 324/755.05 |
| 7,235,990 B1 | 6/2007 | Kreissig et al. | |
| 7,253,648 B2 | 8/2007 | Yang | |
| 2007/0193361 A1 | 8/2007 | Coffey | |
| 2007/0241510 A1 | 10/2007 | Dileo | |
| 2016/0216320 A1 * | 7/2016 | McTigue ........... | G01R 1/06788 |
| 2022/0299545 A1 * | 9/2022 | Kunze ............... | G01R 1/06738 |
| 2025/0164526 A1 * | 5/2025 | Pease ................ | G01R 1/06777 |

* cited by examiner

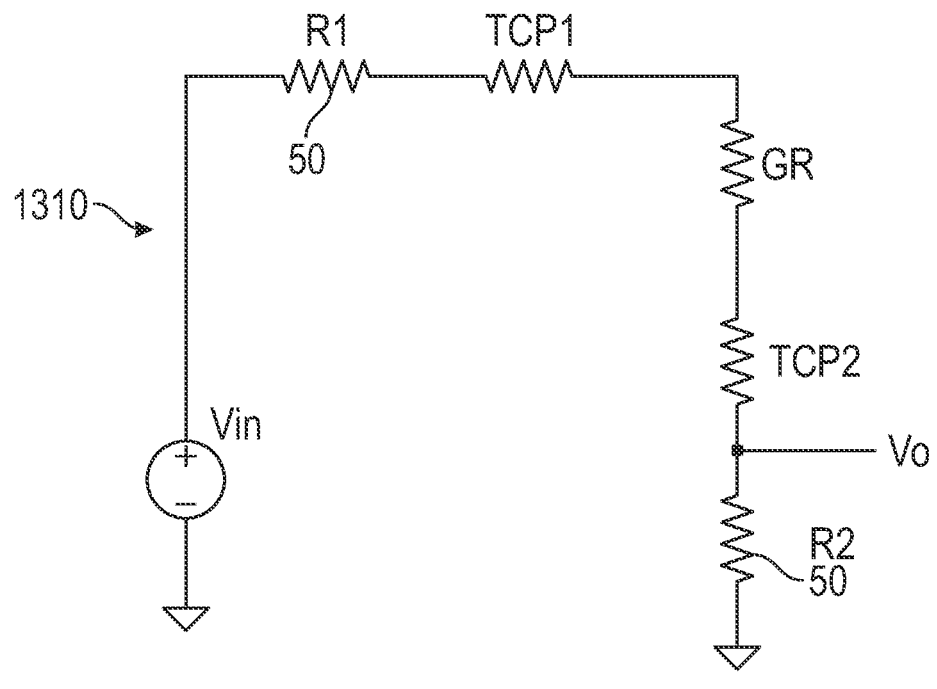
FIG. 13
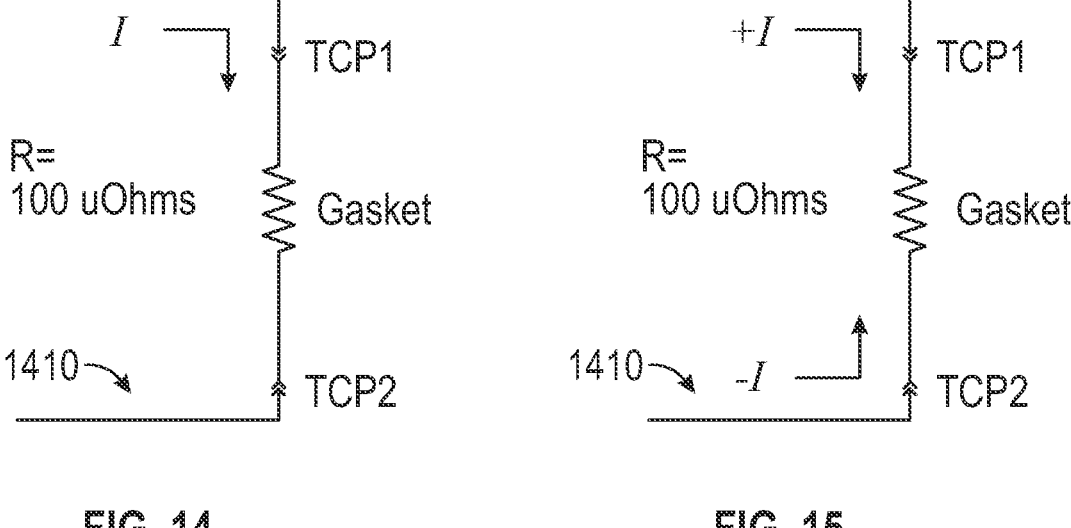
FIG. 14                       FIG. 15

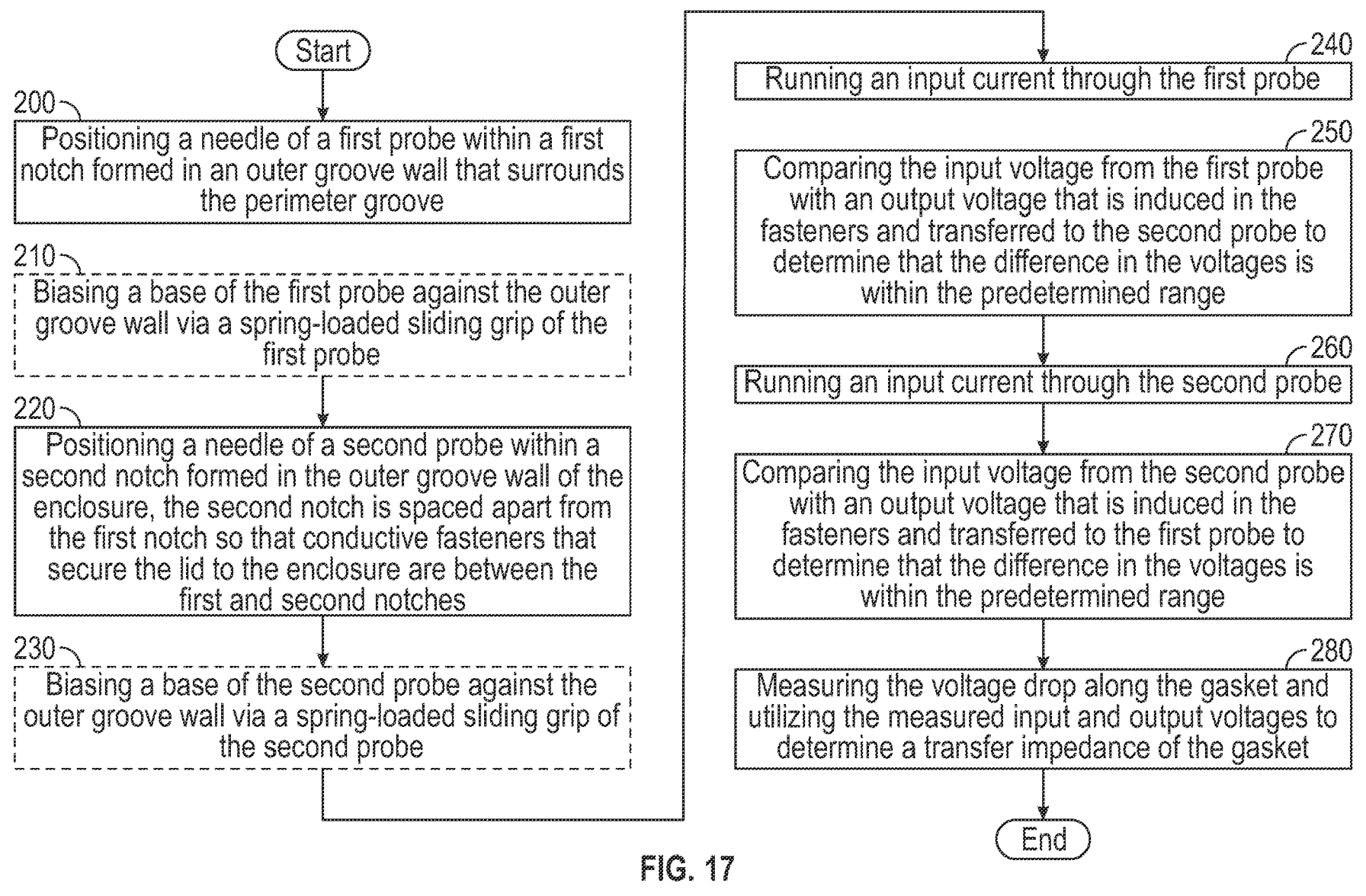

Start

200 — Positioning a needle of a first probe within a first notch formed in an outer groove wall that surrounds the perimeter groove 210 — Biasing a base of the first probe against the outer groove wall via a spring-loaded sliding grip of the first probe 220 — Positioning a needle of a second probe within a second notch formed in the outer groove wall of the enclosure, the second notch is spaced apart from the first notch so that conductive fasteners that secure the lid to the enclosure are between the first and second notches 230 — Biasing a base of the second probe against the outer groove wall via a spring-loaded sliding grip of the second probe 240 — Running an input current through the first probe 250 — Comparing the input voltage from the first probe with an output voltage that is induced in the fasteners and transferred to the second probe to determine that the difference in the voltages is within the predetermined range 260 — Running an input current through the second probe 270 — Comparing the input voltage from the second probe with an output voltage that is induced in the fasteners and transferred to the first probe to determine that the difference in the voltages is within the predetermined range 280 — Measuring the voltage drop along the gasket and utilizing the measured input and output voltages to determine a transfer impedance of the gasket End

FIG. 17

SYSTEM AND METHOD FOR TESTING AN INTEGRITY OF A FACE SEAL IN AN ELECTRICAL SYSTEM

CROSS-REFERENCE TO RELATED APPLICATIONS

This application claims the benefit of Indian Application No. 202311045929 filed Jul. 7, 2023, the disclosure of which is incorporated herein by reference in its entirety.

BACKGROUND

The embodiments are related to electrical systems and more specifically to a system and method for testing an integrity of a face seal in an electrical system.

A face seal is a type of gasket used in electrical systems to provide a seal between two flat surfaces, such as between an electronics enclosure and a cover. The seal is designed to prevent the ingress of dust, water or other contaminants that can damage electronic components or impair their performance. Gaskets can also be used to provide electromagnetic interference (EMI) shielding and electromagnetic compatibility (EMC) shielding in electronic devices. During an assembly process, the gasket may be accidentally left out of the assembly, or the gasket may be damaged such that it splits along its length. Systems without gaskets or with damaged gaskets may be prone to faults and failure.

BRIEF SUMMARY

Disclosed is a method of testing an integrity of a conductive gasket that is located within a perimeter groove formed around a top perimeter edge of a nonconductive enclosure and covered by a nonconductive lid, the method including: positioning a needle of a first probe within a first notch formed in an outer groove wall that surrounds the perimeter groove; and either: injecting an input current through the first probe; and comparing the input voltage from the first probe in the first notch and an output voltage that is induced in conductive fasteners that secure the lid to the enclosure to determine that a difference in the voltages is within a predetermined range, where voltage in the fasteners is measured with another probe; or injecting the input current into at least one of the fasteners; and comparing the input voltage at the fasteners with the output voltage that is induced in the gasket and measured via the first probe in the first notch to determine that the difference in the voltages is within the predetermined range, where voltage in the fasteners is measured with the another probe.

Further disclosed is a another method of testing an integrity of a conductive gasket that is located within a perimeter groove formed around a top perimeter edge of a nonconductive enclosure and covered by a nonconductive lid, the method including: positioning a needle of a first probe within a first notch formed in an outer groove wall of the enclosure; positioning a needle of a second probe within a second notch formed in the outer groove wall of the enclosure, wherein the second notch is spaced apart from the first notch so that conductive fasteners that secure the lid to the enclosure are between the first and second notches; injecting an input current into the first probe; comparing an input voltage from the first probe in the first notch with an output voltage that is induced in the fasteners and transferred to the second probe in the second notch to determine that a difference in the voltages is within a predetermined range, where voltage in the fasteners is measured with another probe.

In addition to one or more aspects of the another method, or as an alternate, the another method includes injecting the input current into the second probe instead of the first probe; comparing the input voltage from the second probe in the second notch with the output voltage that is induced in the fasteners and transferred to the first probe in the first notch to determine that the difference in the voltages is within the predetermined range, where voltage in the fasteners is measured with the another probe; and measuring the voltage drop along the gasket and utilizing measured input and output voltages to determine a transfer impedance of the gasket.

In addition to one or more aspects of the another method, or as an alternate, positioning the needle of the first probe within the first notch includes biasing a base of the first probe against the outer groove wall via a spring-loaded sliding grip of the first probe; and positioning the needle of the second probe within the second notch includes biasing the base of the second probe against the outer groove wall via a spring-loaded sliding grip of the second probe.

Further disclosed is a probe, including: a probe shaft having: a base; a needle extending in a first direction from the base to a first outer end; a top shaft extending in a second direction from the base to a second outer end, the second direction being opposite the first direction; a probe wire connected to the second outer end; a lock member surrounding a first portion of the probe shaft located near the second outer end; a sliding grip surrounding a second portion of the probe shaft that is located adjacent to the first portion of the probe shaft; a spring extending between the base and the sliding grip, wherein, pressing the sliding grip toward the base, compresses the spring and urges the base and the needle in the first direction.

In addition to one or more aspects of the probe, or as an alternate, the probe shaft defines a first outer annular groove located near the second outer end; and the lock member sits at least partially within the first outer annular groove.

In addition to one or more aspects of the probe, or as an alternate, the needle is coated with an insulating coating, except at the first outer end; and the first outer end is conductive.

In addition to one or more aspects of the probe, or as an alternate, the sliding grip has axial opposite ends and a second outer annular groove; the probe includes a cover that is cylindrical and extends between the base and the second outer annular groove of the sliding grip; and the cover has a top plate that defines a center aperture that is sized for a slip fit against the second outer annular groove.

In addition to one or more aspects of the probe, or as an alternate, the needle of the probe is formed of one or more of PdAgCu alloys and high-strength PtNi alloys.

Further disclosed is a system including: a probe as recited in claim 6, wherein the probe is a first probe; an electronics unit, including: a nonconductive enclosure defining a cavity and having a top that provides access to the cavity, the top of the enclosure having a top perimeter edge that defines a perimeter groove having an outer groove wall and an inner groove wall; a conductive gasket disposed in the perimeter groove; a nonconductive lid disposed against the top of the enclosure to enclose the cavity and the perimeter groove; conductive fasteners securing the lid to the enclosure, wherein the fasteners are near the gasket; a first notch defined in the outer groove wall, the first notch is sized to receive the needle of the first probe.

In addition to one or more aspects of the system, or as an alternate, the system is configured for testing a structural integrity of the gasket by: positioning the needle of the first probe within the first notch while biasing the base against of the first probe against the outer groove wall via the sliding grip of the first probe; and either: injecting an input current into the first probe; and comparing the input voltage from the first probe in the first notch with an output voltage that is induced in the conductive fasteners that secure the lid to the enclosure to determine that a difference in the voltages is within a predetermined range, where voltage in the fasteners is measured with another probe; or injecting the input current into at least one of the fasteners; and comparing the input voltage at the fasteners and the output voltage that is induced in the gasket and measured via the first probe in the first notch to determine that the difference in the voltages is within the predetermined range, where voltage in the fasteners is measured with the another probe.

In addition to one or more aspects of the system, or as an alternate, the first notch has a shape that is complimentary to the needle to provide a slip fit therebetween.

In addition to one or more aspects of the system, or as an alternate, the first notch is anodized.

In addition to one or more aspects of the system, or as an alternate, the gasket is an o-ring.

In addition to one or more aspects of the system, or as an alternate, the gasket is one or more of an electromagnetic interference (EMI) shielding gasket and an electromagnetic compatibility interference (EMC) shielding gasket.

In addition to one or more aspects of the system, or as an alternate, the gasket is treated with room-temperature-vulcanizing silicone.

In addition to one or more aspects of the system, or as an alternate, the system further includes a second probe that is the same as the first probe; a second notch defined in the outer groove wall having a same shape as the first notch and spaced apart from the first notch so that the fasteners are between the first and second notches.

In addition to one or more aspects of the system, or as an alternate, the system is configured for testing a structural integrity of the gasket by: positioning the needle of the first probe within the first notch while biasing the base against of the first probe against the outer groove wall via the sliding grip; positioning a needle of the second probe within the second notch while biasing the base of the second probe against the outer groove wall via the sliding grip of the second probe; injecting an input current into the first probe; and comparing the input voltage from the first probe in the first notch with an output voltage that is induced in the fasteners and transferred to the second probe in the second notch to determine that a difference is within a predetermined range, where voltage in the fasteners is measured with another probe.

In addition to one or more aspects of the system, or as an alternate, the system is further configured for testing the structural integrity of the gasket by: injecting the input current into the second probe instead of the first probe; comparing the input voltage from the second probe with the output voltage that is induced in the fasteners and transferred to the first probe in the first notch to determine that the difference in the voltages is within the predetermined range, where voltage in the fasteners is measured with the another probe; and measuring the voltage drop along the gasket and utilizing measured input and output voltages to determine a transfer impedance of the gasket.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 13 shows a schematic of a circuit equivalent of the system of FIG. 12, utilized to measure the transfer impedance of the gasket;

FIG. 14 shows a segment of the circuit of FIG. 13, utilized to measure the transfer impedance of the gasket, where the transfer impedance is determined from measurements following the transferring of power from the first probe to the second probe but not thereafter from transferring of power from the second probe to the first probe;

FIG. 15 shows the segment of the circuit of FIG. 13, utilized to measure the transfer impedance of the gasket, where the transfer impedance is determined from measurements following the transferring of power from the first probe to the second probe and thereafter from transferring of power from the second probe to the first probe;

FIG. 17 is a flowchart showing a method testing an integrity of the gasket as shown in FIG. 12 and determining the transfer impedance of the gasket.

DETAILED DESCRIPTION

The embodiments provide a system and method for determining the integrity of a gasket within an electrical unit. The system and method may be utilized, e.g., once an electrical unit is assembled and before it is placed in service or delivered to customers. The disclosed solution utilizes electrical conductive properties of the gasket to test for its integrity without requiring the disassembly of the electrical system. Using the disclosed solution, a transfer impedance of the gasket may also be determined for evaluating the performance of the gasket.

Figure 1:
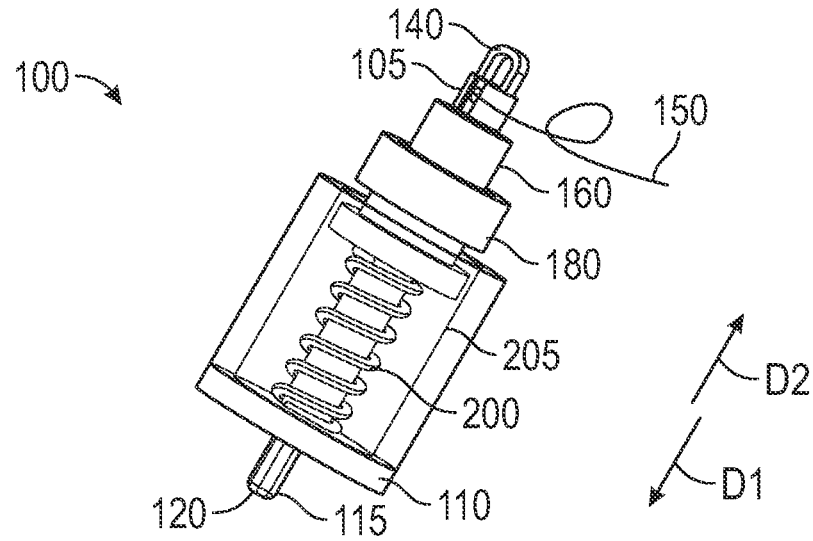
FIG. 1 shows a perspective view of a probe that may be utilized for testing an integrity of a gasket according to the disclosed embodiments.
Figure 2:
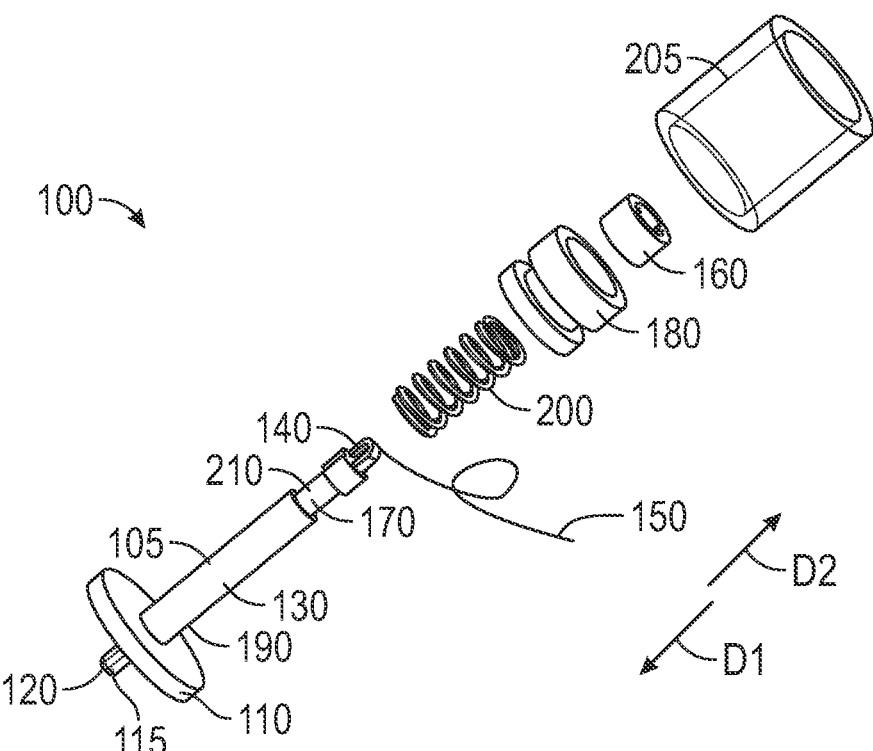
FIG. 2 is an exploded view of the probe.

Turning to FIGS. 1 and 2, a probe 100 is shown which includes a probe shaft 105, which is conductive at least along its center axis. The probe can be used to test the integrity of a gasket in an electrical unit. The probe shaft 105 has a base 110, and a needle (or bottom shaft) 115 that extends in a first direction D1 from the base 110 to a first outer end 120. The needle 115 may have a square or regular cross section, though other cross-sectional shapes are within the scope of the disclosure. A top shaft 130 extends in a second direction D2 from the base 110 to a second outer end 140. The second direction D2 is opposite to the first direction D1. A probe wire 150 is connected to the second outer end 140.

A lock member 160 surrounds a first portion 170 of the shaft 105 located near the second outer end 140. A sliding grip 180, which is a hollow cylinder, surrounds a second portion 190 of the shaft 105 that is located adjacent to the first portion 170 of the shaft 105, between the first portion 170 and the base 110. A spring 200 extends between the base 110 and the sliding grip 180. The lock member 160 prevents the sliding grip 180, and the spring 200, from sliding off the shaft 105 in the second direction D2. The spring 200 is encased in a cylindrical cover 205, that may be transparent, and that extends from the base 110 to the sliding grip 180. In use, pressing the sliding grip 180 toward the base 110, e.g., in the first direction D1, compresses the spring 200 and urges the base 110 and needle 115 in the first direction D1.

The shaft 105 defines a first outer annular groove 210 located near the second outer end 140. The lock member 160 rests at least partially within the first annular groove 210.

Figure 3:
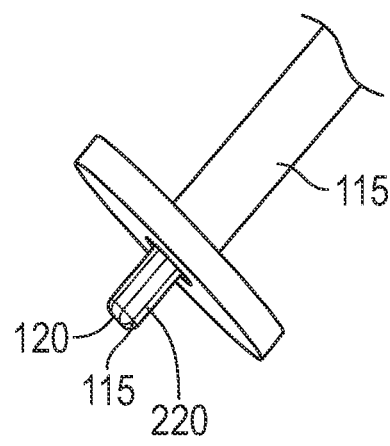
FIG. 3 shows a portion of a shaft of the probe.
Figure 4:
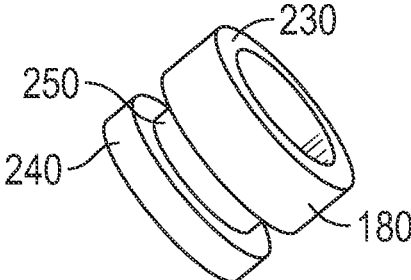
FIG. 4 shows a sliding grip of the probe.
Figure 5:
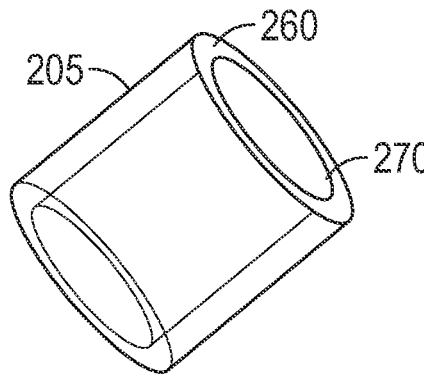
FIG. 5 shows a cover of the probe.

As shown in FIG. 3, the needle 115 of the shaft 115, except at the first outer end 120, is coated with an insulating coating 220 around its sidewall, and the first outer end 120 is conductive and flat. The probe needle 115 is formed of one or more of PdAgCu alloys and high-strength PtNi alloys. As shown in FIG. 4, the sliding grip 180 has axial opposite ends 230, 240 and a second outer annular groove 250 between the opposite ends 230, 240. As shown in FIG. 5, the cover 205 has a top plate 260 that defines a center aperture 270 that is sized for a slip fit around the second annular groove 250 of the sliding grip 180. With this configuration, the cover 205 and axial size of the second annular groove 250 defines an axial sliding range of motion for the sliding grip 180 when pressed against the spring 200.

Figure 6:
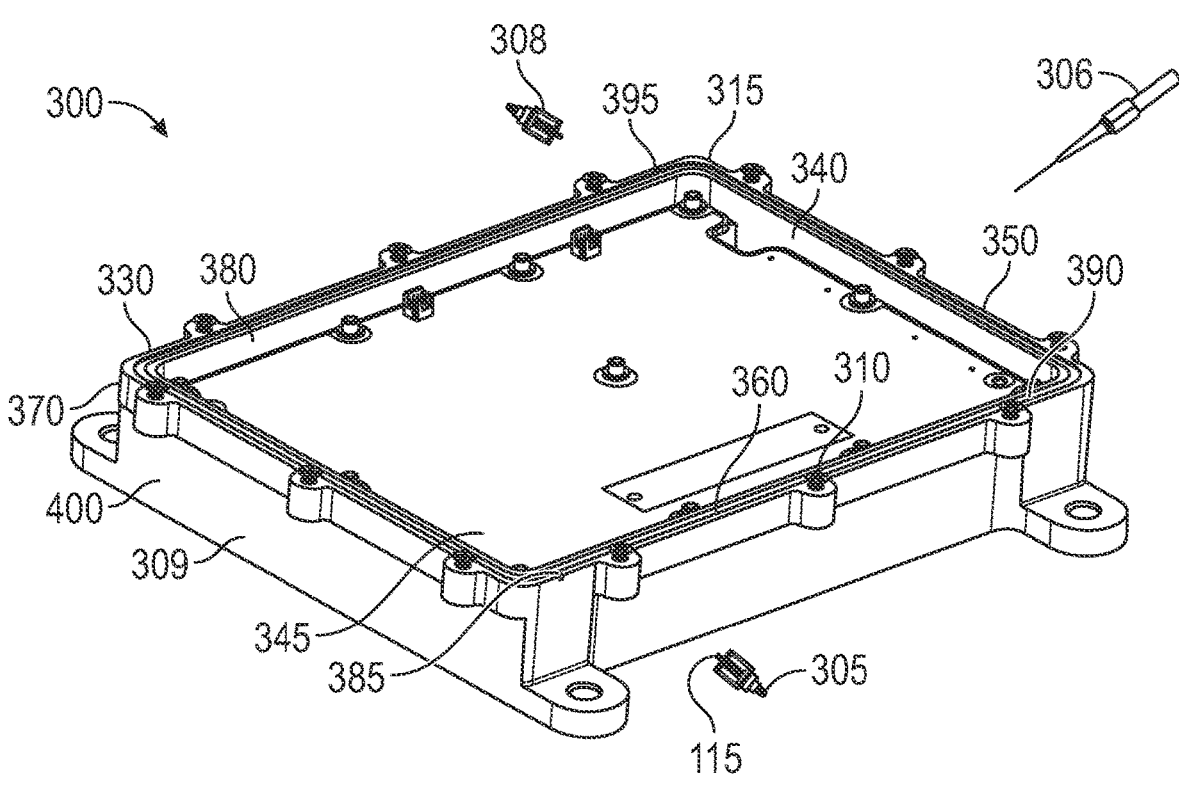
FIG. 6 shows an electronics unit having an enclosure with a gasket that may be tested with the probe, where the unit is without a cover.

Turning to FIG. 6, a system 300 includes an electronics unit 309, a first probe 305, which is the same as the probe 100 and a needle end probe 306 (otherwise referred to as another probe), e.g., of the type utilized with a multimeter. The needle end probe 306 is one non-limiting example of a generally available probe and is not intended on limiting scope of the embodiments. The electronics unit 309 includes a nonconductive enclosure 315 having a top 330 that provides access to a cavity 340, in which electronics 345 are stored. The top 330 has a top perimeter edge 350 that defines a perimeter groove 360 having an outer groove wall 370 facing an outside of the enclosure 315 and an inner groove wall 380 facing the cavity 340.

A conductive gasket 390 is disposed in the perimeter groove 360. The gasket 390 may be an O-ring. The gasket 390 may be an electromagnetic interference (EMI) shielding gasket or an electromagnetic compatibility interference (EMC) shielding gasket. The gasket 390 may be treated with room-temperature-vulcanizing silicone. A first anodized notch 385 is defined in the outer groove wall 370 that provides access to the gasket 390. The first notch 385 is sized and shaped to receive the needle 115 of the first probe 305 with a slip fit. That is the first notch 385 has a perimeter shape that is the same as the cross-sectional shape of the needle 115. This prevents unwanted rotation of the first probe 305 in the first notch 385. A second notch 395 that is the same size and shape as the first notch 385 may be formed in the outer groove wall 370, spaced apart from the first notch 385. For example, the notches 385, 395 may be formed on different walls 400, such as opposite walls of the enclosure 315 and at opposite corners of a rectangular shaped enclosure 315 as shown in FIG. 6. The second groove 395 may seat a second probe 308 that is the same as the first probe 305. The notch size may be 1.2 mm×1.2 mm, and the probe needle 115 may be configured with 1 mm wide sidewalls.

Figure 7:
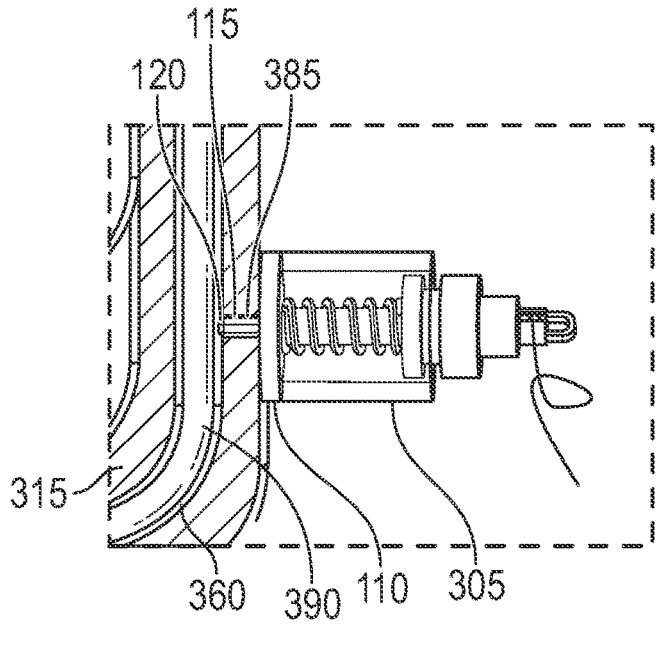
FIG. 7 shows a needle of the probe inserted into a notch of the enclosure.

Conductive fasteners 310 are provided for securing a nonconductive lid 420 (FIG. 8) to the top 330 of the enclosure 315. The fasteners 310 are near the gasket 390 and may fit within threaded apertures 430 formed in the outer groove wall 370. FIG. 7 shows the needle 115 of the probe 305 in the notch 385. With the base 110 of the probe 305 pressed against the enclosure 315, the first end 120 of the needle 115 contacts the gasket 390 in the groove 360.

With the above embodiments, the probe 305 is configured so that an installer may feel and visualize the needle movement by observing the spring movement under the transparent cover 205. If the needle 115 is pressed with a high force against the gasket 390, then spring 200 will become more compressed and provide a greater reaction force. The reaction forces serve as feedback to the installer, who can avoid rupturing the gasket 390 with the needle 115.

Figure 8:
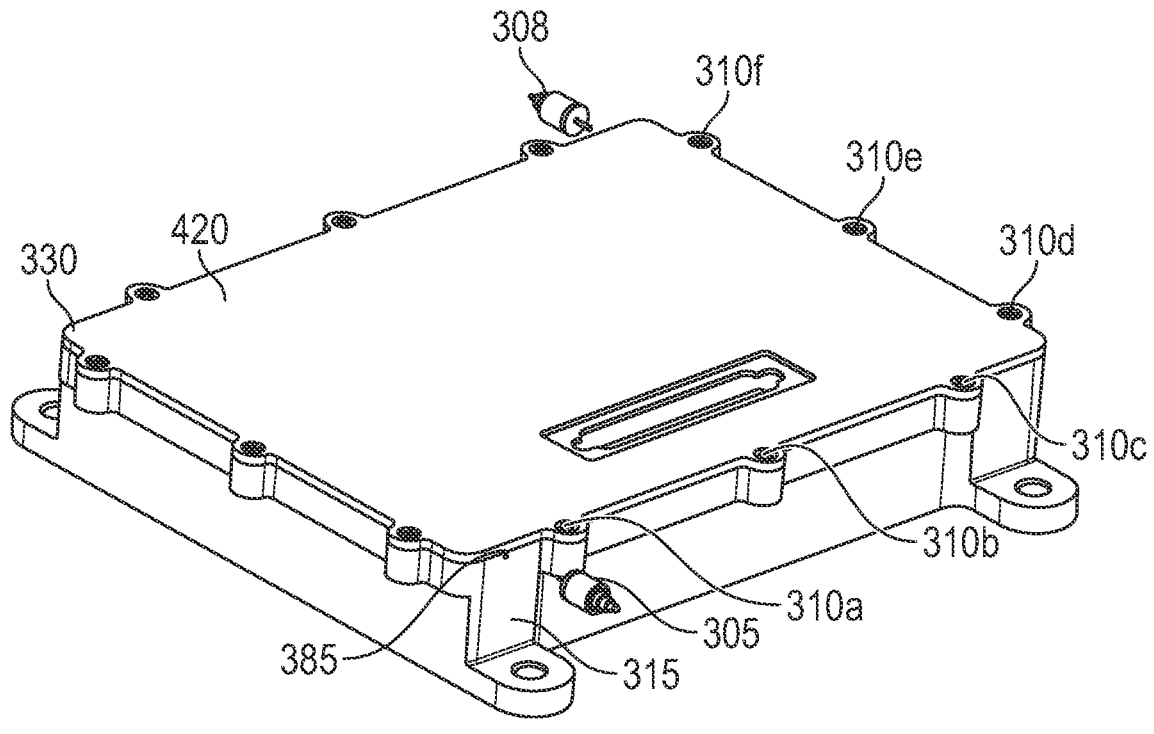
FIG. 8 shows the electronics unit with a cover.
Figure 9:
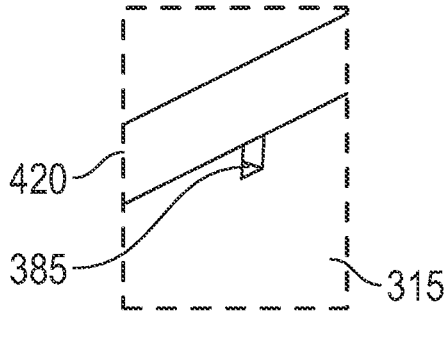
FIG. 9 shows the notch formed in the enclosure.

Turning to FIG. 8, the lid 420 is disposed against the top 330 of the enclosure 315 to enclose the cavity 340 (FIG. 6) and perimeter groove 360 (FIG. 6). The figure shows the first notch 385 and the fasteners 310a-310f distributed around the enclosure 315, between the probes 305, 308. FIG. 9 shows the first notch 385 formed along the enclosure 315, and the lid 420 over the enclosure 315 and the notch 385.

Figure 10:
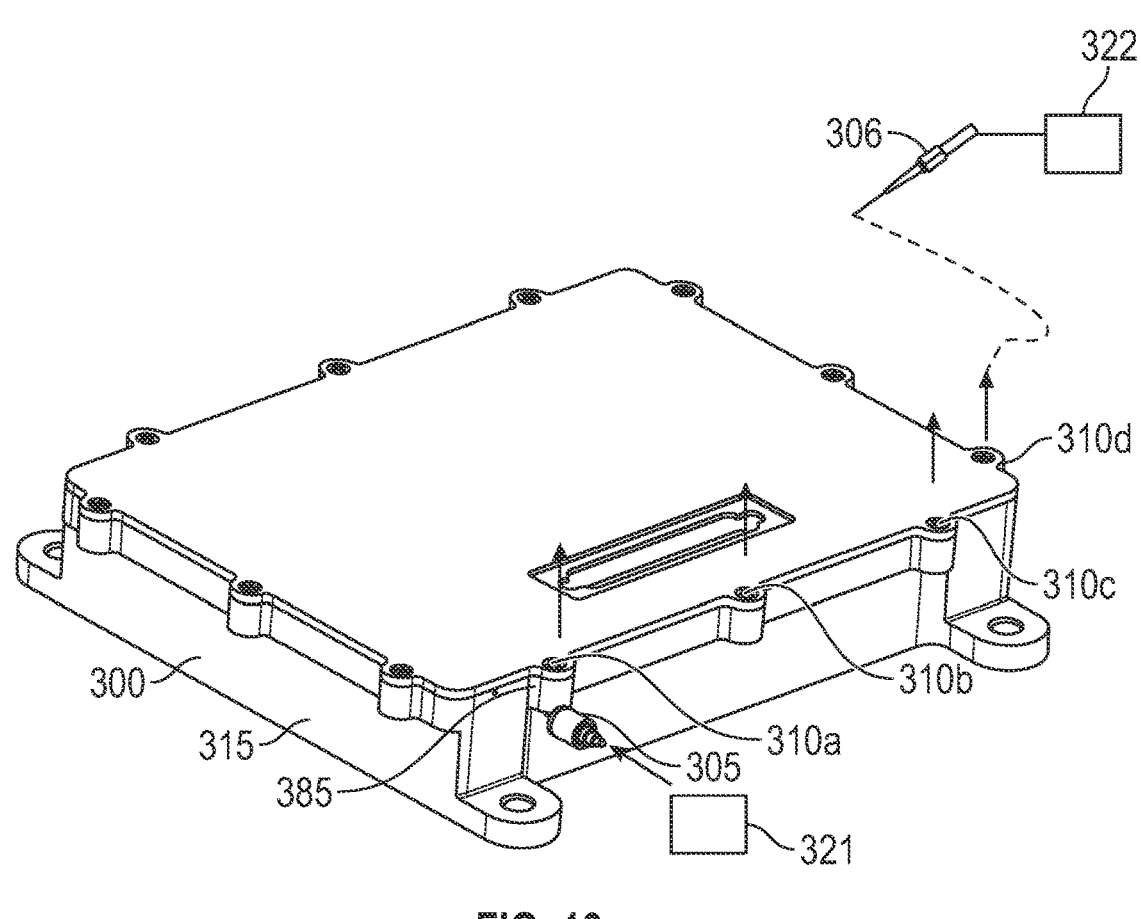
FIG. 10 shows the electronics unit with a probe inserted into a notch formed along a top of the enclosure, and where a gasket integrity is tested by transferring power transmitted through the probe and measuring continuity at conductive fasteners that connect the lid to the enclosure.

As shown in FIG. 10, the system 300 may be utilized for testing an integrity of the gasket 390 (FIG. 6) that is secured within the enclosure 315, utilizing the first probe 305 located in the first notch 385 connected to a current supply 321. Current is injected through the gasket 390 via the probe 305. The needle probe 306 is utilized to measure voltage output at each of the fasteners 310 using an appropriate meter 322. Providing continuity along the gasket 390 is complete, i.e., the gasket is not damaged, a voltage is induced in each of the fasteners 310a-310d. The voltage is measured at the input and output, i.e., at the probe 305 as the input and each of the fasteners 310a-310d, one by one, as the output. Providing the voltage difference between input and output falls within a predetermined range, the gasket 390 is in an acceptable condition. Otherwise, the gasket 390 can be replaced.

Figure 11:
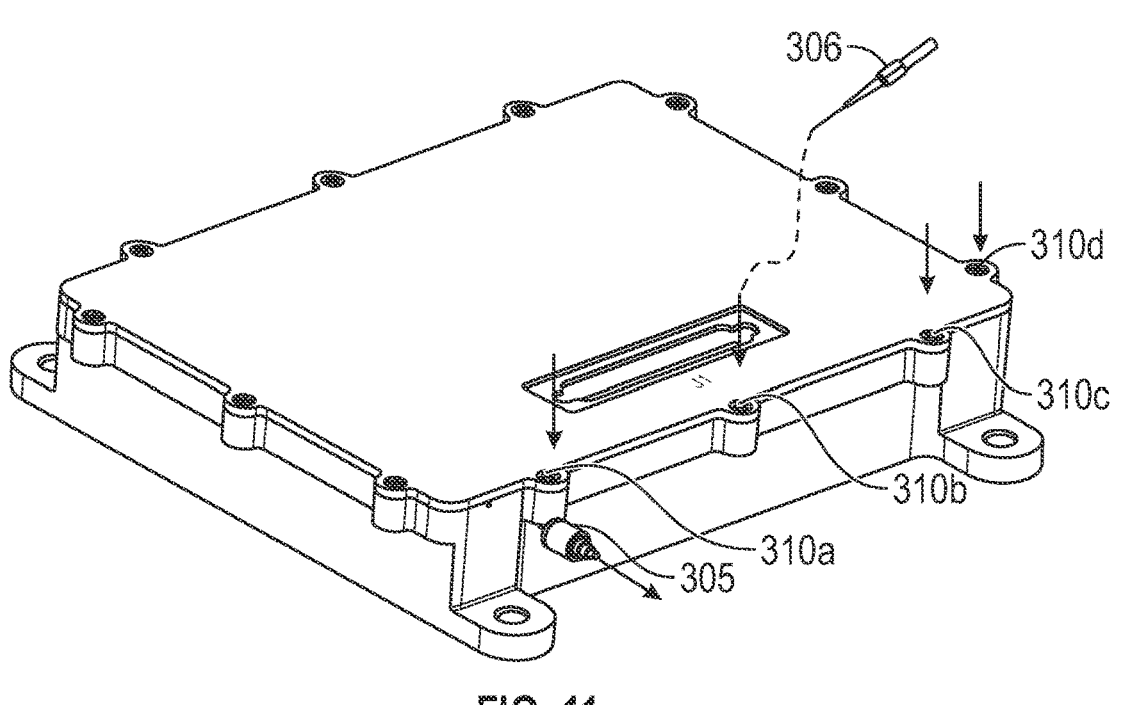
FIG. 11 shows the electronics unit with the probe inserted into the notch, and where the gasket integrity is tested by transferring power into each of the fasteners, one at a time, and measuring continuity at the probe.

Alternatively, as shown in FIG. 11, a current can be applied to each of the fasteners 310a-310d, one by one, utilizing the needle probe 306 connected to a current supply. A voltage is induced in the gasket 390 (FIG. 6), which is measured utilizing the probe 305. The voltage is measured at the input and output, i.e., at each of the fasteners 310a-310d, one by one, as the input, and the probe 305 as the output. As indicated, providing the voltage difference between the input and output falls within a predetermined range, the gasket 390 is in an acceptable condition. Otherwise, the gasket 390 can be replaced.

Figure 12:
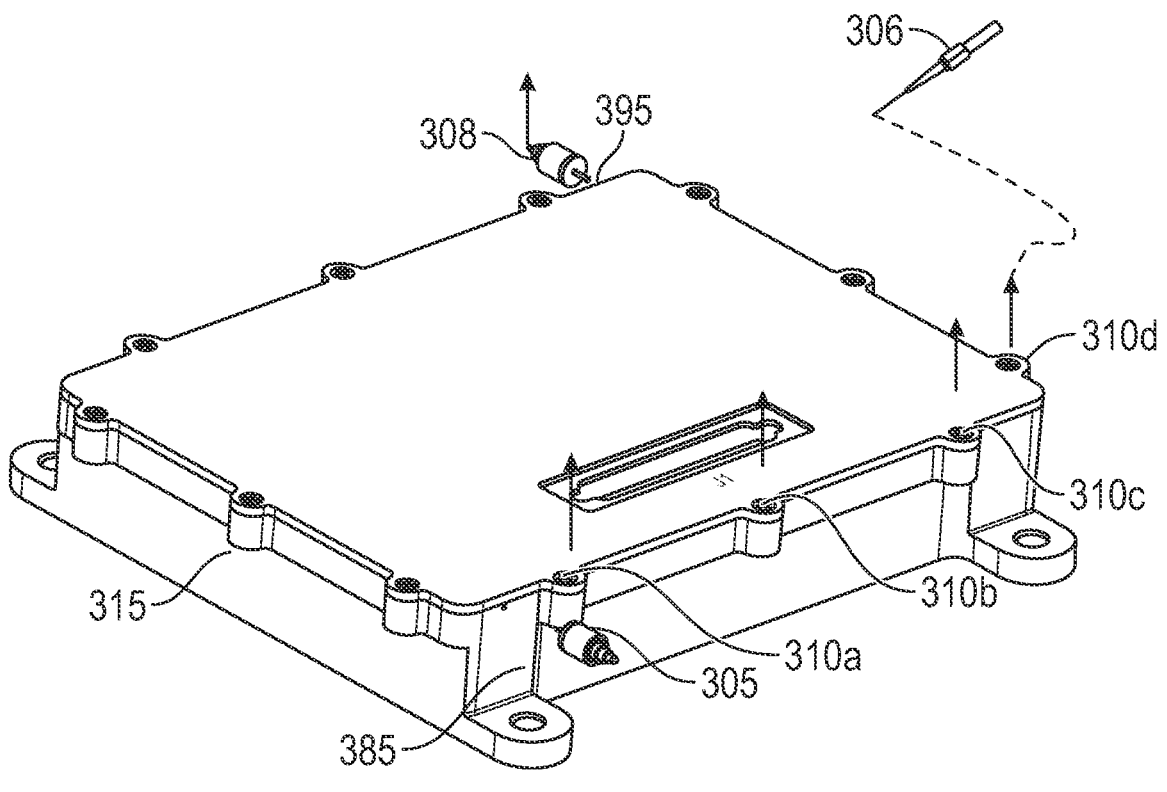
FIG. 12 shows the electronics unit with first and second probes respectively inserted into first and second notches formed along the top of the enclosure, and where the gasket integrity is tested by transferring power into the first probe, and measuring continuity at the fasteners and the second probe, and where the process is then repeated in the reverse order, and the resulting power measurements at the probes is utilized to measure transfer impedance of the gasket.

As shown in FIG. 12, the system 300 may be utilized for testing the integrity of the gasket 390 that is secured within the enclosure 315 utilizing the first probe 305 in the first notch 385 and the second probe 308 in the second notch 395. Current is injected through the gasket 390 and the second probe 308 via the probe 305. Providing continuity along the gasket 390 is complete, i.e., the gasket is not damaged, a voltage is induced in each of the fasteners 310*a*-310*d*. The voltage is measured at the input and output, i.e., at the first probe 305 as the input, and each of the fasteners 310*a*-310*d*, one by one, utilizing the needle probe 306, as well as the second probe 308 as the output. Providing the voltage difference, between measured input and output, falls within a predetermined range, the gasket 390 is in an acceptable condition. Otherwise, the gasket 390 can be replaced.

The same testing method implicated in FIG. 12 can be executed with current provided via the second probe 308, which would voltage current in the fasteners 310*a*-310*d* and would exit via the first probe 305. The voltage is measured at the input and output, i.e., at the second probe 308 as the input, and each of the fasteners 310*a*-310*d*, one by one, as well as the first probe 305 as the output. Providing the voltage differences between input and output falls within a predetermined range, the gasket 390 is in an acceptable condition. Otherwise, the gasket 390 can be replaced.

Testing the induced voltage at the fasteners 310 and between the probes 305, 308 confirms the presence and physical continuity of the gasket 390. However, the measuring technique applied with the configuration of FIG. 12 can also be utilized to determine the transfer impedance of the gasket 390. This can be useful in determining the performance characteristics of the gasket 390. For example, the transfer impedance is indicative of the conductivity of the gasket 390 when applied to the joint surfaces in the enclosure 315. The impedance is also indicative of the effect that forces applied on the gasket 390 will have on the gasket shielding. The impedance is also indicative of the effects that moisture and salt fog environments will have on the conductivity of the gasketed joints, which may be an issue in certain applications.

Specifically, directly injecting current into the gasketed 390 via the probes 305, 308 induces voltage in the fasteners 310 due to the generated electromagnetic field. The voltage across the gasket joints may be measured from this process, e.g., utilizing a meter. The ratio of voltage and current over the unit length of the gasket 390 defines the transfer impedance of the gasket 390, expressed in units of dB Ohm/m with a repeatability of +/−2 dB. The transfer impedance of the gasket 390 may be measured according to the following equation: $Z_T=(Vo/I)*L$. In this equation, $Z_T$=Transfer Impedance (ohm-m), I=Input Current (Amps), Vo=Output Voltage (Volts), L=Length of gasket (meters).

Turning to FIG. 13, a circuit equivalent 1310 of the dual probe configuration of the system 300 is shown, which is utilized to measure the transfer impedance of the gasket 390. In the figure, R1 is a source resistance in Ω (ohms), TCP1 is the thermal contact resistance in Ω, GR is the gasket resistance measured in Ω, TCP2 is the thermal contact resistance in Ω, and R2 is the receiver resistance in Ω. For impedance measurement, a known level of current from, for example, a 50 ohm source enters the 50 ohm input (first) probe 305, is terminated in a precision 50 ohm resistor and is delivered to the second probe 308. The current flows outward from the contact needle 115 of the input probe 305, through the assembled gasket 390, and back to the contact needle 115 of the return probe 308. The voltage drop across the gasket 390 under the test is measured by a 50 ohm receiver attached to the return probe 308. Turning to FIGS. 14 and 15, the resistance being measured is, e.g., 100 μΩ, and a test current, I is, e.g., 100 mA. Thermal contact potentials, TCP1 and TCP2, are typically 1 mV. With these values, with the segment 1410 of the circuit 1310 shown in FIG. 14, the measured resistance is calculated as (TCP1+ GR+TCP2)/I=(1 mV+0.01 mV+1 mV)/100 mA=20.1 mΩ. In FIG. 15, a first measurement in the segment 1410 will be the same as in FIG. 14, i.e., 20.1 mΩ. A second measurement is (−TCP1+GR+−TCP2)/I=(−1 mV+0.01 mV+−1 mV)/100 mA=−19.9 mΩ, and the average value 20.1 mΩ−19.9 mΩ/2=100 μΩ. By performing two measurements and averaging the results, the effects of thermal contact voltage on low-resistance measurements is eliminated.

With the embodiments, an advantage of using the grooved transfer impedance approach is that test results indicate that an accurate, predicted shielding may be obtained with a gasketed joint. The resultant test data can be converted to levels of shielding quality using, e.g., Ohms Law. The results of the testing can be used to predict accurate levels of shielding offered by the gasket 390, e.g., an EMI gasket, when employed against the various materials used in the electronics system 300 over the life of a system 300.

Figure 16:
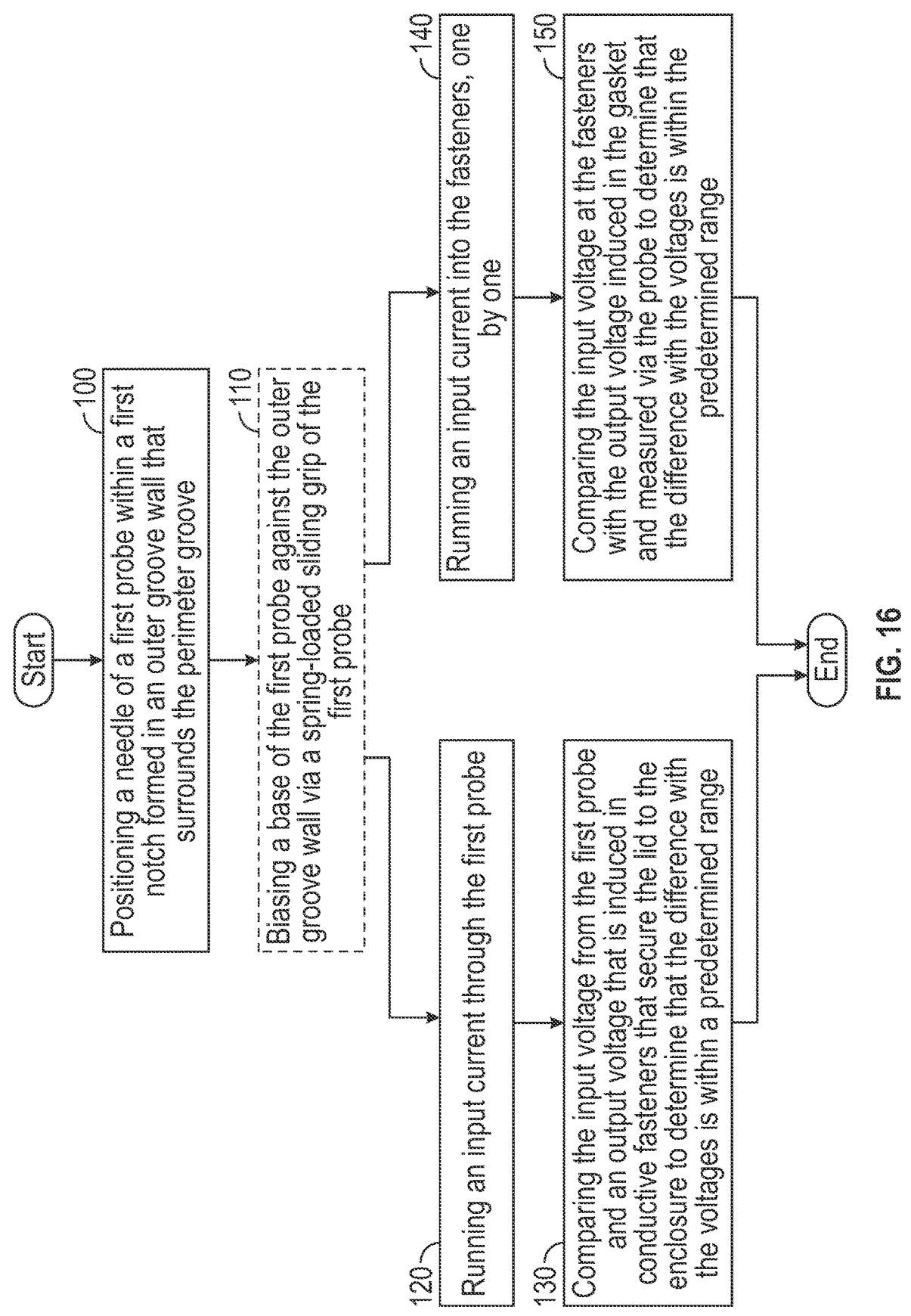
FIG. 16 is a flowchart showing a method testing an integrity of the gasket as shown in FIGS. 10 and 11.

Turning to FIG. 16, the flowchart shows a method of testing the integrity of the gasket 390 located within the perimeter groove 360 of the enclosure 315 and covered by the lid 420. FIG. 16 is directed to testing the structural integrity of the gasket using the first probe 305 and not the second probe 308. That is, FIG. 16 relates to the measurements shown in FIGS. 10 and 11. As shown in block 100, the method includes positioning the needle 115 of the first probe 305 within the first notch 385 formed in the outer groove wall 370 that surrounds the perimeter groove 360. As shown in block 110, positioning of the needle 115 in the groove 360 (block 100) may include biasing the base 110 of the first probe 305 against the outer groove wall 370 via a spring-loaded sliding grip 180 of the first probe 305.

As shown in block 120, the method includes injecting an input current through the first probe 305, i.e., the configuration shown in FIG. 10. As shown in block 130, the method includes comparing the induced input voltage from the probe 305 and an output voltage that is induced in the fasteners 310 that secure the lid 420 to the enclosure 315 to determine that the difference with the voltage is within a predetermined range.

As shown in block 140, the method includes injecting the input current into the fasteners 310, one by one, i.e., the configuration shown in FIG. 11. As shown in block 150, the method includes comparing the input voltage at the fasteners 310 with the output voltage induced in the gasket 390 and measured via the probe 305 to determine that the difference with the voltage is within the predetermined range.

Turning to FIG. 17, the flowchart shows a method of testing the integrity of the gasket 390 located within the perimeter groove 360 of the enclosure 315 and covered by the lid 420. FIG. 17 is directed to testing the integrity of the gasket using the first probe 305 and the second probe 308. That is, FIG. 17 relates to the measurements shown in FIG. 12.

As shown in block 200, the method includes positioning the needle 115 of the first probe 305 within the first notch 385 formed in the outer groove wall 370 that surrounds the perimeter groove 360. As shown in block 210, positioning of the needle 115 in the groove 360 (block 200) may include biasing the base 110 of the first probe 305 against the outer groove wall 370 via the spring-loaded sliding grip 180 of the first probe 305.

As shown in block 220, the method includes positioning the needle 115 of the second probe 308 within the second notch 395 formed in the outer groove wall 370 that surrounds the perimeter groove 360. The second notch 295 is spaced apart from the first notch 385 so that the conductive fasteners 310 that secure the lid 420 to the enclosure 315 are between the first and second notches 385, 395. As shown in block 230, positioning of the needle 115 in the groove 360 of the second probe 308 (block 220) may include biasing the base 110 of the second probe 308 against the outer groove wall 370 via the spring-loaded sliding grip 180 of the second probe 308. As shown in block 240, the method includes injecting an input current through the first probe 305. As shown in block 250, the method includes comparing the input voltage from the first probe 305 with an output voltage that is induced in the fasteners 310 and transferred to the second probe 308 to determine that the difference in the voltage is within the predetermined range.

As shown in block 260, the method also includes injecting the input current through the second probe 308. As shown in block 270, the method includes comparing the input voltage from the second probe 308 with the output voltage that is induced in the fasteners 310 and transferred to the first probe 305 to determine that the difference in the voltage is within the predetermined range. As shown in block 280, the method further includes measuring (or determining) the voltage drop along the gasket 390 and utilizing the measured input and output voltages to determine a transfer impedance of the gasket 390.

The terminology used herein is for the purpose of describing particular embodiments only and is not intended to be limiting of the present disclosure. The term "about" is intended to include the degree of error associated with measurement of the particular quantity and/or manufacturing tolerances based upon the equipment available at the time of filing the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of testing an integrity of a conductive gasket that is located within a perimeter groove formed around a top perimeter edge of a nonconductive enclosure and covered by a nonconductive lid, the method comprising:

positioning a needle of a first probe within a first notch formed in an outer groove wall that surrounds the perimeter groove; and either:

injecting an input current through the first probe; and comparing an input voltage from the first probe in the first notch and an output voltage that is induced in conductive fasteners that secure the nonconductive lid to the nonconductive enclosure to determine that a difference in the voltages is within a predetermined range, where voltage in the conductive fasteners is measured with another probe;

or injecting an input current into at least one conductive fasteners; and comparing an input voltage at the at least one conductive fasteners with an output voltage that is induced in the conductive gasket and measured via the first probe in the first notch to determine that a difference in the voltages is within a predetermined range, where voltage in the at least one conductive fasteners is measured with the another probe.

2. The method of claim 1, wherein:

positioning the needle of the first probe within the first notch includes biasing a base of the first probe against the outer groove wall via a spring-loaded sliding grip of the first probe.

3. A method of testing an integrity of a conductive gasket that is located within a perimeter groove formed around a top perimeter edge of a nonconductive enclosure and covered by a nonconductive lid, the method comprising:

positioning a needle of a first probe within a first notch formed in an outer groove wall of the enclosure;

positioning a needle of a second probe within a second notch formed in the outer groove wall of the nonconductive enclosure, wherein the second notch is spaced apart from the first notch so that conductive fasteners that secure the nonconductive lid to the nonconductive enclosure are between the first and second notches;

injecting an input current into the first probe;

comparing an input voltage from the first probe in the first notch with an output voltage that is induced in the conductive fasteners and transferred to the second probe in the second notch to determine that a difference in the voltages is within a predetermined range, where voltage in the conductive fasteners is measured with another probe.

4. The method of claim 3, further comprising:

injecting the input current into the second probe;

comparing an input voltage from the second probe in the second notch with an output voltage that is induced in the conductive fasteners and transferred to the first probe in the first notch to determine that the difference in the voltages is within the predetermined range, where voltage in the conductive fasteners is measured with another probe; and measuring the voltage drop along the conductive gasket and utilizing the measured input and output voltages to determine a transfer impedance of the conductive gasket.

5. The method of claim 3, wherein:

positioning the needle of the first probe within the first notch includes biasing a base of the first probe against the outer groove wall via a spring-loaded sliding grip of the first probe; and positioning the needle of the second probe within the second notch includes biasing a base of the second probe against the outer groove wall via a spring-loaded sliding grip of the second probe.

6. A system comprising:

a probe, comprising:

a probe shaft having:

a base;

a needle extending in a first direction from the base to a first outer end;

a top shaft extending in a second direction from the base to a second outer end, the second direction being opposite the first direction;

a probe wire connected to the second outer end;

a lock member surrounding a first portion of the probe shaft located near the second outer end;

a sliding grip surrounding a second portion of the probe shaft that is located adjacent to the first portion of the probe shaft;

a spring extending between the base and the sliding grip, wherein, pressing the sliding grip toward the base, compresses the spring and urges the base and the needle in the first direction, wherein the probe is a first probe;

an electronics unit, including:

a nonconductive enclosure defining a cavity and having a top that provides access to the cavity, the top of the nonconductive enclosure having a top perimeter edge that defines a perimeter groove having an outer groove wall and an inner groove wall;

a conductive gasket disposed in the perimeter groove;

a nonconductive lid disposed against the top of the nonconductive enclosure to enclose the cavity and the perimeter groove;

conductive fasteners securing the nonconductive lid to the nonconductive enclosure, wherein the conductive fasteners are near the conductive gasket;

a first notch defined in the outer groove wall, the first notch is sized to receive the needle of the first probe.

7. The system of claim 6, wherein:

the probe shaft defines a first outer annular groove located near the second outer end; and the lock member sits at least partially within the first outer annular groove.

8. The system of claim 6, wherein:

the needle is coated with an insulating coating, except at the first outer end; and the first outer end is conductive.

9. The system of claim 6, wherein:

the sliding grip has axial opposite ends and a second outer annular groove;

the probe includes a cover that is cylindrical and extends between the base and the second outer annular groove of the sliding grip; and the cover has a top plate that defines a center aperture that is sized for a slip fit against the second outer annular groove.

10. The system of claim 6, wherein the needle of the probe is formed of one or more of PdAgCu alloys and high-strength PtNi alloys.

11. The system of claim 6, wherein:

the system is configured for testing a structural integrity of the conductive gasket by:

positioning the needle of the first probe within the first notch while biasing the base of the first probe against the outer groove wall via the sliding grip of the first probe; and either:

injecting an input current into the first probe; and comparing an input voltage from the first probe in the first notch with an output voltage that is induced in the conductive fasteners that secure the nonconductive lid to the nonconductive enclosure to determine that a difference in the voltages is within a predetermined range, where voltage in the conductive fasteners is measured with another probe;

or injecting an input current into an at least one of the conductive fasteners; and comparing an input voltage at the at least one of the conductive fasteners and an output voltage that is induced in the conductive gasket and measured via the first probe in the first notch to determine that the difference in the voltages is within the predetermined range, where voltage in the at least one of the conductive conductive fasteners is measured with another probe.

12. The system of claim 6, wherein the first notch has a shape that is complimentary to the needle to provide a slip fit therebetween.

13. The system of claim 6, wherein the first notch is anodized.

14. The system of claim 6, wherein the conductive gasket is an o-ring.

15. The system of claim 6, wherein the conductive gasket is one or more of an electromagnetic interference (EMI) shielding gasket and an electromagnetic compatibility interference (EMC) shielding gasket.

16. The system of claim 6, wherein the conductive gasket is treated with room-temperature-vulcanizing silicone.

17. The system of claim 6, further comprising:

a second probe that is the same construction as the first probe;

a second notch defined in the outer groove wall having a same shape as the first notch and spaced apart from the first notch so that the at least one of the conductive conductive fasteners are between the first and second notches.

18. The system of claim 17, wherein:

the system is configured for testing a structural integrity of the conductive gasket by:

positioning the needle of the first probe within the first notch while biasing a base against of the first probe against the outer groove wall via a sliding grip;

positioning a needle of the second probe within the second notch while biasing the base of the second probe against the outer groove wall via the sliding grip of the second probe;

injecting an input current into the first probe; and comparing an input voltage from the first probe in the first notch with an output voltage that is induced in the conductive fasteners and transferred to the second probe in the second notch to determine that a difference is within a predetermined range, where voltage in the fasteners is measured with another probe.

19. The system of claim 18, wherein:

the system is further configured for testing the structural integrity of the conductive gasket by:

injecting the input current into the second probe;

comparing an input voltage from the second probe with an output voltage that is induced in the conductive fasteners and transferred to the first probe in the first notch to determine that a difference in the voltages is within a predetermined range, where voltage in the conductive fasteners is measured with another probe; and measuring a voltage drop along the conductive gasket and utilizing the measured input and output voltages to determine a transfer impedance of the conductive gasket.

* * * * *